United States Patent [19]

Barzilai et al.

[11] Patent Number: 4,698,830
[45] Date of Patent: Oct. 6, 1987

[54] SHIFT REGISTER LATCH ARRANGEMENT FOR ENHANCED TESTABILITY IN DIFFERENTIAL CASCODE VOLTAGE SWITCH CIRCUIT

[75] Inventors: Zeev Barzilai, Millwood; Vijay S. Iyengar, Peekskill, both of N.Y.; Gabriel M. Silberman, Haifa, Israel

[73] Assignee: International Business Machines Corporation, Armonk, N.Y.

[21] Appl. No.: 850,189

[22] Filed: Apr. 10, 1986

[51] Int. Cl.⁴ .................... G01R 31/28; G11C 29/00
[52] U.S. Cl. .......................................... 377/19; 377/81; 371/25; 324/73 R; 307/465; 307/471; 307/272.2
[58] Field of Search ............... 377/19, 81; 307/272 A, 307/443, 465; 371/1, 16, 25, 70; 324/73 R

[56] References Cited

U.S. PATENT DOCUMENTS

| | | | |
|---|---|---|---|
| 4,070,648 | 1/1978 | Mergenthaler et al. | 371/70 |
| 4,442,521 | 4/1984 | Inaba | 371/70 |
| 4,542,505 | 9/1985 | Binoeder et al. | 371/25 |
| 4,564,774 | 1/1986 | Tashiro et al. | 371/25 |
| 4,602,210 | 7/1986 | Fasang et al. | 324/73 R |

Primary Examiner—John S. Heyman
Attorney, Agent, or Firm—Terry J. Ilardi

[57] ABSTRACT

A shift register latch (SRL) arrangement for testing a combinational logic circuit, producing true and complement outputs in nature, has two clocked DC latches and additional circuitry for providing an input to the second latch. Clock signal trains and an extra TEST signal are used to control the SRL arrangement in different modes. In a first mode, one of the outputs from the combinational logic circuit is latched into the first latch and provided to a succeeding combinational logic circuit. In a second mode, a plurality of the SRL arrangements are interconnected together to form a shift register chain so that each latch acts as one position of the shift register chain. Further, in a third mode, the true and complement outputs of the combinational logic circuit are exclusive ORed and its result is latched into the second latch. During the third mode, output of the first latch is prevented from being latched into the second latch.

6 Claims, 5 Drawing Figures

SHIFT REGISTER LATCH ARRANGEMENT FOR ENHANCED TESTABILITY IN DIFFERENTIAL CASCODE VOLTAGE SWITCH CIRCUIT

BACKGROUND OF THE INVENTION

1. Field of the Invention

This invention relates to shift register latch (SRL) arrangements for use in digital computers and the like and, more particularly, to a structure of an SRL arrangement for use in such systems to render it operable to fully test a specific type of combinational logic circuit producing complementary outputs such as a differential cascode voltage switch (DCVS) circuit.

2. Description of the Prior Art

DCVS is a circuit scheme recently developed for CMOS type devices, which not only provides high functional density and excellent performance characteristics but also has the unique property of inherent testability due to the presence of a pair of complementary outputs from every logic tree. This type of circuit is disclosed by Heller et al in a technical paper entitled "Cascode Voltage Switch Logic Family - A Differential CMOS Logic Family" appearing in *Digest of Proceedings of IEEE International Solid-State Circuits Conference*, Vol. 27, San Francisco (February 1984), pp. 16–17.

A typical DCVS circuit is partitioned into any number of basic building blocks called logic modules, each consisting of a logic tree and an associated buffer and precharge circuit. The buffer and precharge circuits are generally identical but the internal structure of the logic trees may be different depending on which logical function each logic tree is designed to represent. The DCVS circuit relies upon the presence of complementary signals at all points. Each primary input has complement and true versions, respectively. The tree outputs of a logic module, including the logic tree, are complement and true versions of the same logic signal. The inputs to the logic trees are either the complementary versions of the primary inputs or the complementary versions of the tree outputs of different logic trees.

For further details of the rules governing logical behavior of these modules, reference should be made to copending U.S. patent application Ser. No. 709,612, filed Mar. 8, 1985 by Z. Barzilai et al and assigned to the assignee of this invention.

DCVS circuits have many advantages. All logic functions can be implemented either by adequately interconnecting differential pairs of NMOS switches in a logic tree or by connecting its complementary tree outputs to other logic trees as their complementary inputs to thereby form a more powerful DCVS circuit comprising a group of logic modules. In the latter case, such a DCVS circuit may be formed as a combinational logic circuit which has multiple pairs of complementary inputs and multiple pairs of complementary outputs. Another important point is that, under normal operation for any combination of complementary input signals, a DCVS circuit should be double rail in nature, i.e., each logic module of the DCVS circuit in this case produces a pair of complementary outputs indicative of a result of the function it implements.

In order to alleviate the problems in testing aforesaid DCVS circuits of large scale integration (LSI) type, it has been proposed to incorporate shift register latches (SRLs) into DCVS designs in accordance with the existing "level sensitive scan design" or LSSD scheme. The latter scheme is fully described in a technical article by E. B. Eichelberger et al entitled "A Logic Design Structure for LSI Testability" appearing in *Proceedings of 14th Design Automation Conference*, June 1977, pp. 462–468.

In this prior approach, only a single tree output from the DCVS circuit is observed by latching it into the SRLs. Unfortunately, most manufacturing defects in a DCVS circuit, which may be modeled as single stuck-at faults as fully discussed in the above cited copending patent application, cause the true and complement tree outputs from the DCVS circuit not to be complements of each other. Therefore, the problem with this prior approach is the loss of observability points when testing for manufacturing defects.

Further, in a recent technical article by J. B. Hickson et al entitled "Testing Scheme for Differential Cascode Voltage Switch Circuits" appearing in *IBM Technical Disclosure Bulletin*, Vol. 27, No. 10B, Mar. 1985, pp. 6148–6152, there is described a testing scheme for enhancing observability of a DCVS circuit by placing an exclusive OR circuit at the output of every DCVS logic tree and by detecting whether its output value is in a legal state. However, the testing scheme is a big departure from the existing LSSD scheme and requires a substantial overhead in that there is provided a single exclusive OR circuit for each DCVS logic tree. Further, the testing scheme requires a sophisticated hierarchical wiring arrangement for certain error flag lines to ensure proper signal strengths.

SUMMARY OF THE INVENTION

Accordingly, it is an object of the invention to provide an improved shift register latch (SRL) arrangement which is in keeping with the existing LSSD scheme and requires a minimum overhead in order to provide high degree of testability for a specific type of combinational logic circuit such as a DCVS circuit.

It is a further object of the invention to provide an improved SRL arrangement of the aforementioned type which includes an exclusive OR circuit connected to true and complement output lines of a combinational logic circuit thereby enabling to latch the exclusive ORed result into one of the latches of the SRL arrangement.

In accordance with the above objects of the invention, there is provided a basic SRL arrangement adapted for testing a specific type of combinational logic circuit, such as a DCVS circuit having at least one pair of output lines, which produces either complementary output signals indicative of a result of a logical function performed when faultless, or non-complementary output signals on the output lines when a fault in the combinational logic circuit is propagated to these output lines. The basic SRL arrangement of the invention comprises, in addition to a first latch device and a second latch device which are arranged in keeping with the existing LSSD scheme, separate control circuitry designed to effectively make use of the aforementioned characteristics of the combinational logic circuit. This control circuitry includes input means for the second latch device and test data input means, which in turn includes exclusive OR circuit means connected to the output lines of the combinational logic circuit. Further, the control circuitry includes disabling means, which is responsive to an extra TEST signal line for disabling the input means of the second latch device, thereby enabling to latch the exclusive ORed result into the second latch device.

BRIEF DESCRIPTION OF THE DRAWINGS

The invention will be described further, by way of a preferred example thereof, with reference to the accompanying drawings wherein like reference numerals have been used in the several views to depict like elements. In said drawings.

DETAILED DESCRIPTION OF PREFERRED EMBODIMENT

Figure 1:
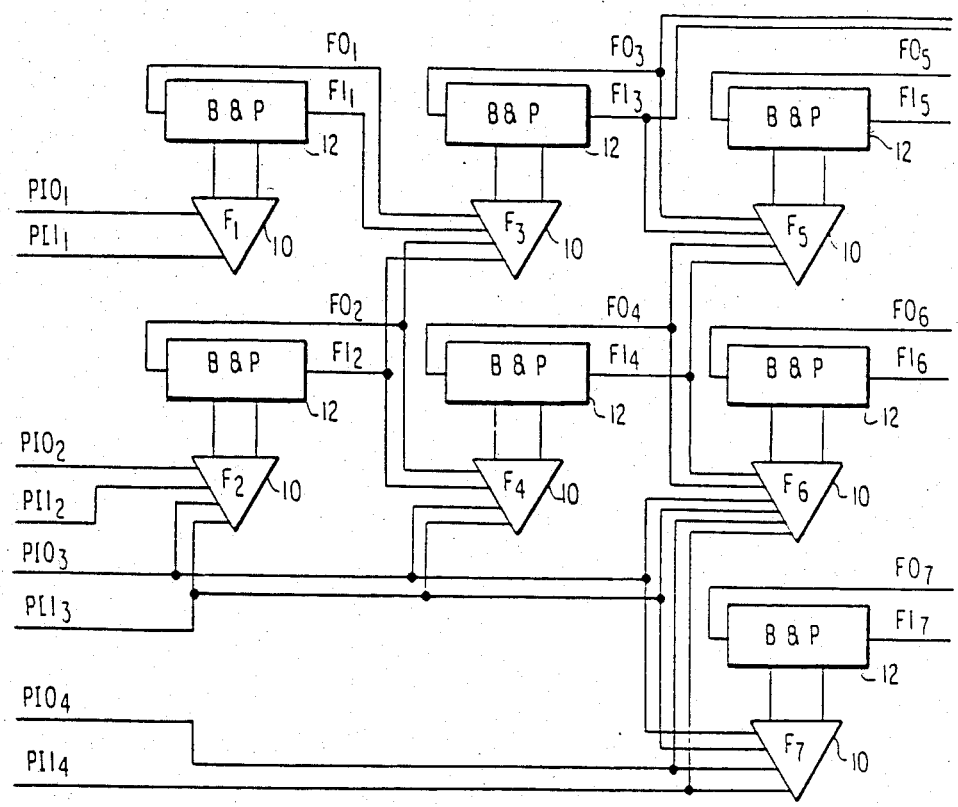
FIG. 1 is a schematic diagram of a prior art DCVS circuit.

An example of a prior art DCVS circuit is shown in FIG. 1. The circuit is partitioned into any number of basic building blocks called logic modules, each consisting of a logic tree 10 and an associated buffer and precharge circuit 12. The buffer and precharge circuits 12 are generally identical but the internal structure of the logic trees 10 may be different depending on which logical function each logic tree 10 is designed to represent. The DCVS circuit relies upon the presence of complementary signals at all points. Each primary input has complement and true versions $PI0_i$ and $PI1_i$, respectively. The tree outputs of a logic module including the logic tree 10 are complement and true versions $F0_i$ and $F1_i$ of the same logic signal. The inputs to the logic trees 10 are either the complementary versions of the primary inputs $PI0_i$ and $PI1_i$ or the complementary versions of the tree outputs $F0_i$ and $F1_i$ of different logic trees 10.

Figure 2:
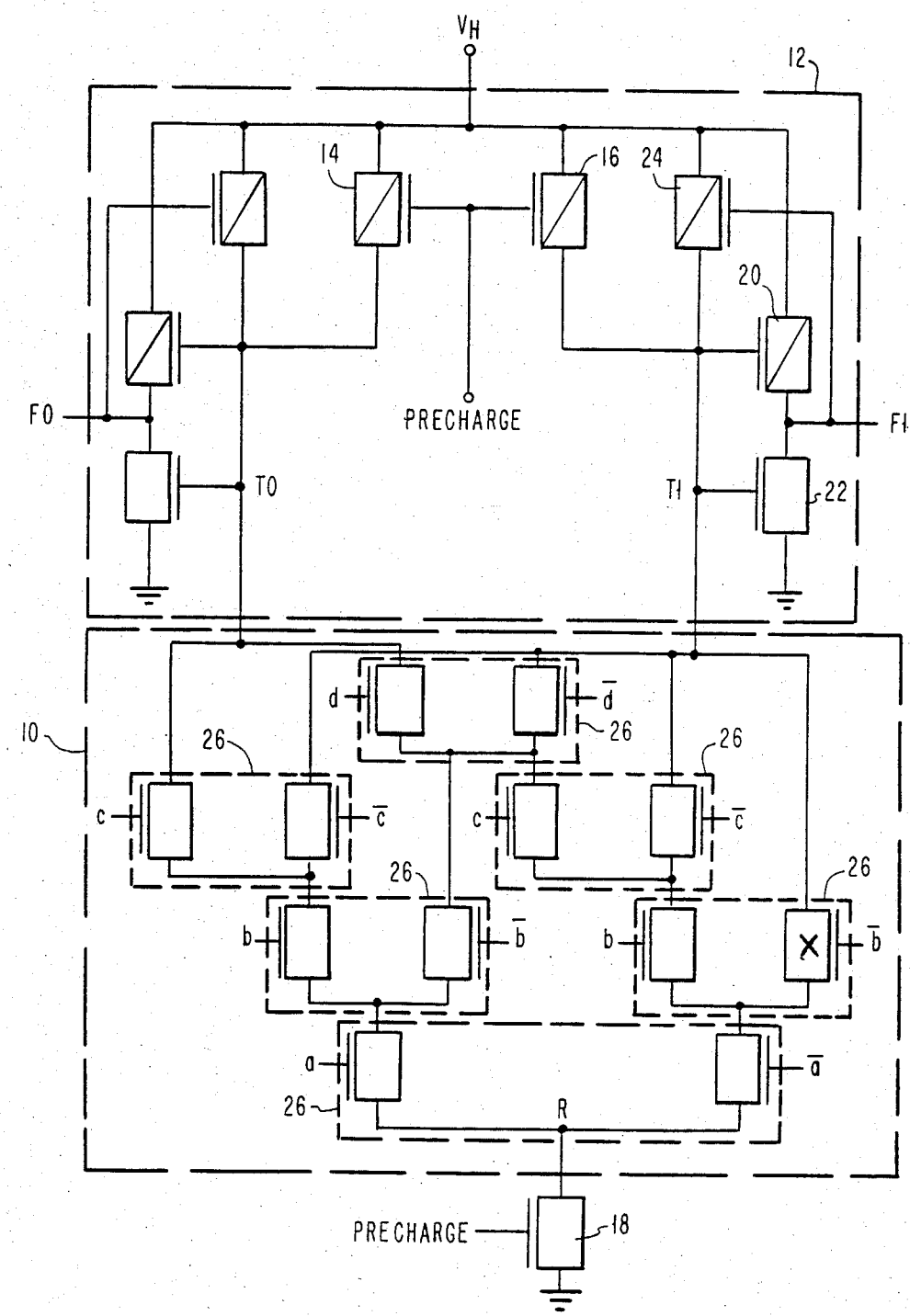
FIG. 2 is a schematic diagram of an exemplary DCVS logic module consisting of a logic tree and its associated buffer and precharge circuit.

In FIG. 2, there is shown an exemplary internal structure of the DCVS logic module which consists of the logic module 10 and the buffer and precharge circuit 12. The general rules followed in building the logic tree 10 by interconnection of differential pairs 26 ensure that, for any combination of the complementary input signals (e.g., a and ā, b and b̄, etc., as shown), there is one conducting path only either from a complement internal node T0 or from a true internal node T1 to a grounding node R. This is true inasmuch as the NMOS switches in the logic tree 10 are properly operating and the paired input signals are complementary to each other. For further details of the rules, reference should be made to copending patent application Ser. No. 709,612, filed Mar. 8, 1985 by Z. Barzilai et al and assigned to the assignee of this invention.

The operation of the DCVS logic module, the building block or the simplest form of a DCVS circuit, is now briefly described. During a precharge period, the PRECHARGE signal controlling upper PMOS precharge switches 14, 16 and a lower NMOS precharge switch 18 goes low, thus isolating the logic tree 10 from ground but connecting it to a positive voltage supply. Thus, the internal nodes T0 and T1 are charged to a high signal level, which causes a complement tree output node F0 and a true tree output node F1 to go low due to the presence of a CMOS inverter 20,22 at the right half and its corresponding counterpart at the left half. A PMOS feedback switch 24 and its corresponding counterpart hold the internal nodes T0, T1 statically high during the precharge period. These switches reduce charge sharing noise within the logic tree 10 and improve the noise margin. During an evaluation period subsequent to the precharge period, when the PRECHARGE signal goes high and the lower precharge switch 18 is closed, either the internal node T0 or T1 is discharged depending on the values of the complementary input signals being applied to the logic tree 10. After evaluation, the signals on the internal node T0 should be complementary to the signal on the internal node T1 as are the tree outputs nodes F0 and F1. The CMOS inverters cause the tree outputs nodes F0 and F1 to be complementary to their corresponding internal nodes T0 and T1.

DCVS circuits have many advantages. All logic functions can be implemented either by adequately interconnecting the differential pairs 26 of NMOS switches in the logic tree 10 or by connecting its complementary tree outputs F0, F1 to other logic trees as their complementary inputs thereby to form a more powerful DCVS circuit comprising a group of logic modules as shown in FIG. 1. In the latter case, such DCVS circuit may be formed as a combinational logic circuit which has multiple pairs of complementary inputs and multiple pairs of complementary outputs. Another important point is that, under normal operation for any combination of complementary input signals, a DCVS circuit should be double rail in nature, i.e., each logic module of the DCVS circuit in this case produces a pair of complementary outputs indicative of a result of the function it implements.

Figure 3:
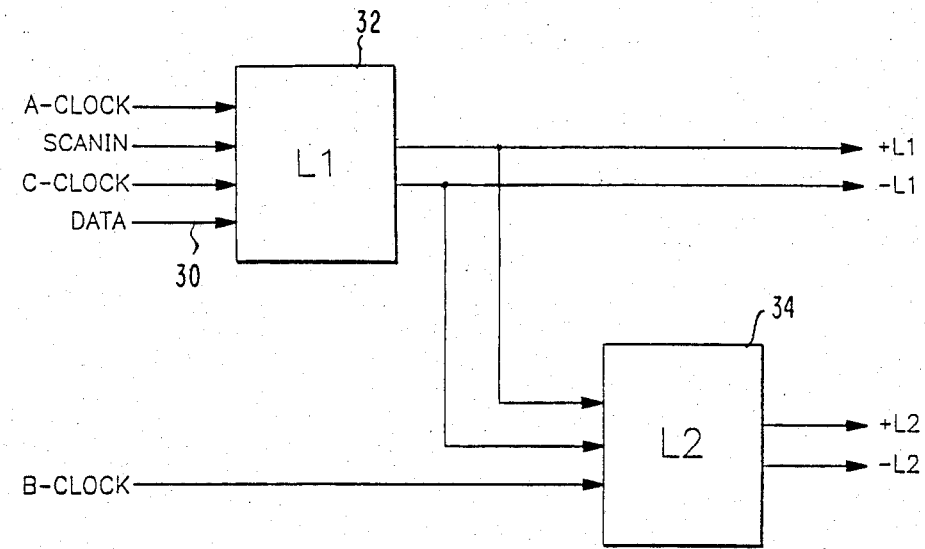
FIG. 3 is a schematic diagram of the structure of the prior art for incorporating a shift register latch (SRL) into DCVS designs.

In order to alleviate the problems in testing aforesaid DCVS circuits of large scale integration (LSI) type, there has been proposed to incorporate the shift register latches (SRLs) into DCVS designs in accordance with the existing "level sensitive scan design (LSSD)" scheme. The latter scheme is fully described in a technical article by E. B. Eichelberger et al entitled "A Logic Design Structure for LSI Testability" appearing in *Proceedings of 14th Design Automation Conference*, June 1977, pp. 462–468. The general structure of the prior approach can be logically represented as in FIG. 3. In this approach, a single tree output (which may be a signal on either the complement tree output node F0 or the true tree output node F1 shown in FIG. 2) is provided on a DATA line 30 and is latched into an L1 latch 32 when a C-CLOCK line goes high. The true and complement outputs +L1, −L1 of the L1 latch 32 are then used to drive an L2 latch 34. Note that other implementation details of this approach are the same as those described in the above cited article by Eichelberger et al. On the other hand, most manufacturing defects or realistic faults in a DCVS circuit, which may be modeled as a set of single stuck-at faults as fully discussed in the above cited copending patent application, can cause the true and complement tree outputs from the DCVS circuit not to be complements of each other. This actually happens when a fault from the fault set exists in the DCVS circuit and such fault is propagated to the outputs thereof. Therefore, the problem with this prior approach is the loss of observability points when testing for manufacturing defects.

Further, in a recent technical article by J. B. Hickson et al entitled "Testing Scheme for Differential Cascode Voltage Switch Circuits" appearing in *IBM Technical Disclosure Bulletin,* Vol. 27, No. 10B, Mar. 1985, pp. 6148-6152, there is described a testing scheme for enhancing observability of a DCVS circuit by placing an exclusive OR circuit at the output of every DCVS logic tree and by detecting whether its output value is in a legal state. However, the testing scheme is a big departure from the existing LSSD scheme and requires a substantial overhead in that there is provided a single exclusive OR circuit for each DCVS logic tree. Further, the testing scheme requires, in addition to an error flag line called STILLHI? to be bussed through the chip, a sophisticated hierarchical wiring for the error flag lines to ensure proper signal strengths.

Figure 4:
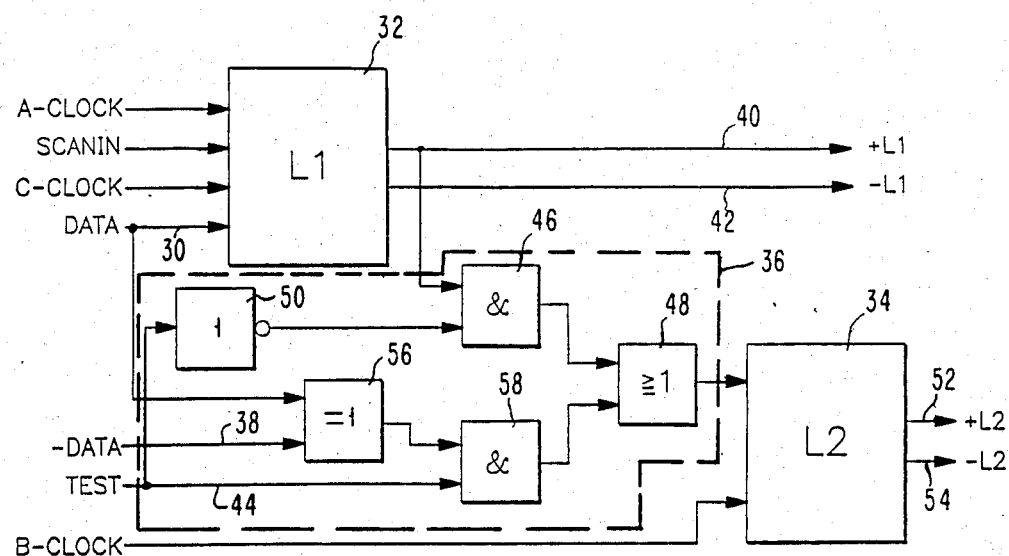
FIG. 4 is a schematic diagram of the structure of the basic SRL arrangement in accordance with the present invention.

In FIG. 4, there is shown a block diagram of the basic shift register latch (SRL) arrangement of the present invention. In the design of a data processing system and the like having a number of logic functions to be performed, large scale integration (LSI) provides semiconductor chips each having a number of the basic SRL arrangements shown in FIG. 4 to be coupled to associated DCVS circuits (not shown). The basic SRL arrangement represents a single binary bit position of system logic, and is comprised of an L1 latch 32 and an L2 latch 34 which may be configured in accordance with either the single-latch design or the double-latch design as fully disclosed in the above cited article by Eichelberger et al. Note that only the single-latch form is shown in FIG. 4 for sake of example. As contrasted with the prior SRL arrangements, the basic SRL arrangement of the invention is tailored to have an additional control circuitry 36 so that it can support, in addition to the conventional operational modes called "functional mode" and "LSSD mode", a unique mode called "DCVS test capture mode".

Before describing the DCVS test capture mode, operations of the other two modes will be described with reference to FIG. 4. Each of the DCVS circuits may be any combination of the building blocks or logic modules previously described and produces at least one pair of true and complement tree outputs. These paired tree outputs are provided on the corresponding DATA line 30 and −DATA line 38 respectively. During the functional mode, the basic SRL arrangement normally receives a C-CLOCK signal which is operative to set the L1 latch 32 to the condition presented by the DATA line 30. The DATA signal latched into the L1 latch 32 and provided as complementary signals on +L1 line 40 and −L1 line 42 can then be supplied to a succeeding DCVS circuit (not shown) for normal system operation. In the functional mode, a TEST signal on line 44 and a B-CLOCK signal are inactive so that the signal on +L1 line 40 is not latched into the L2 latch 34.

The basic SRL arrangement is adapted to operate in the LSSD mode, when data on the SCANIN line is to be shifted into the L1 latch 32 and the L2 latch 34 from some input source other than the DCVS circuit, or when the contents of these latches are to be shifted out. In the LSSD mode, A-CLOCK and B-CLOCK signals are activated with the TEST signal on line 44 at logic 0 in order to permit the basic SRL arrangement of FIG. 4 to be interconnected in a shift register fashion with other SRL arrangements in a manner widely known in the art. The activation of A-CLOCK signal is effective to set the L1 latch 32 in accordance with the data presented on the SCANIN line. The output signal on +L1 line 40 from the L1 latch 32 is then latched into the L2 latch 34 through an AND circuit 46 and an OR circuit 48 when a B-CLOCK signal is activated. The other enabling input to the AND circuit 46 is an output of an inverter 50 which is in turn connected to the TEST line 44. Needless to say, the output of the L2 latch 34 on line 52 or 54 can be provided to succeeding SRL arrangements through SCANIN lines thereof by repetitive activation of the A-CLOCK and B-CLOCK signals.

Further, the A-CLOCK signal is non-overlapping or out-of-phase with respect to the B-CLOCK signal. As fully discussed in the above cited article by Eichelberger et al, implementation detail of these clock signals (such as frequency, width and phase difference) is a function of the time required to reliably set the L1 latch 32 or L2 latch 34, and some maximum amount of delay through the associated DCVS circuit.

Turning now to a discussion of the DCVS test capture mode, the additions which must be made to support this mode include an exclusive OR (XOR) circuit 56 which is connected to DATA line 30 and −DATA line 38. The XOR circuit 56 is introduced before the L2 latch 34 to reduce the impact on performance for the functional mode. Further, the TEST line 44 is activated in this mode to disable the AND circuit 46 and to latch the XORed result of the complementary tree outputs on lines 30 and 36 into the L2 latch 34 through an AND circuit 58 and the OR circuit 48 when a B-CLOCK signal is activated. Note that the DCVS test capture mode cannot be used alone to test the DCVS circuit, but it is used in combination with the LSSD mode as described below.

Figure 5:
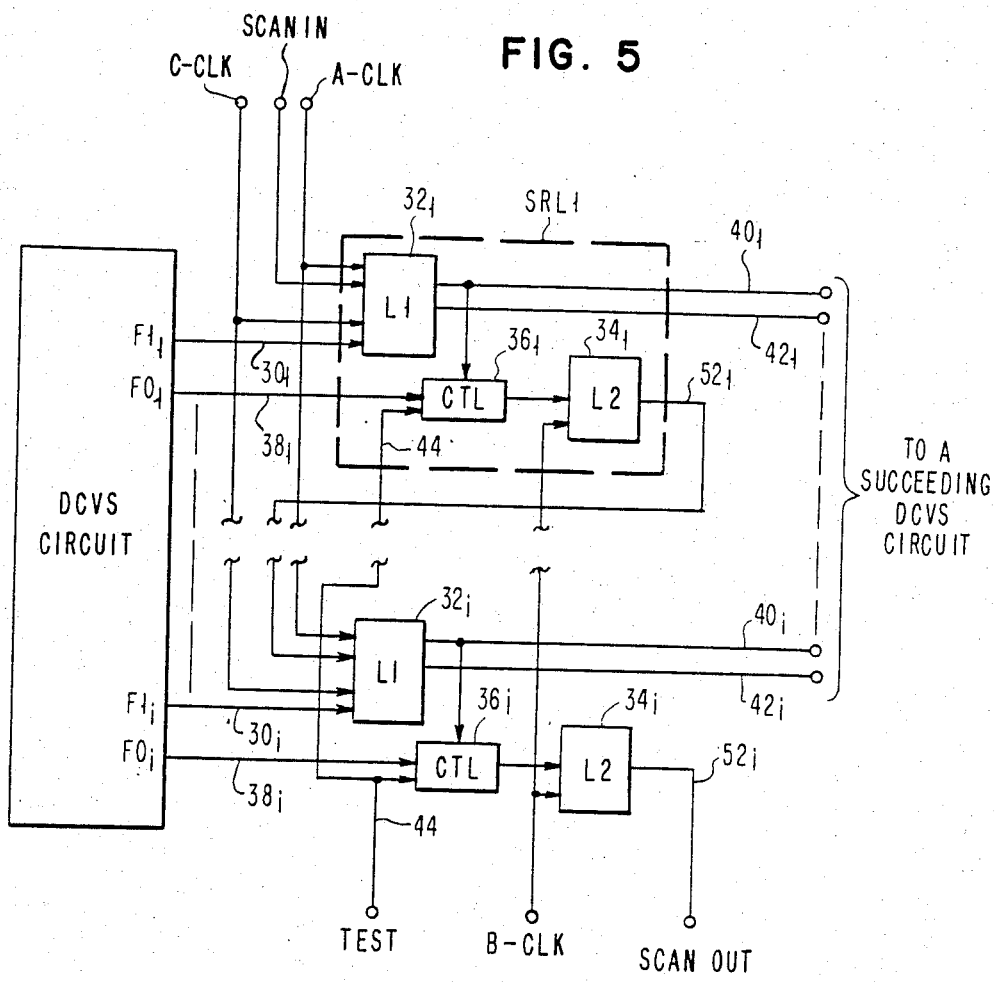
FIG. 5 is a schematic illustration of the manner in which a plurality of the SRL arrangements of FIG. 4 are interconnected to provide a shift register chain.

FIG. 5 is a schematic representation of how a plurality of the basic SRL arrangements of FIG. 4 would be interconnected at the output side of the DCVS circuit. Note that, for brevity of drawing, FIG. 5 does not show the similar SRL arrangements to be interconnected in the same manner at the input side of the DCVS circuit. It is evident from FIG. 5 that, in comparison with the existing LSSD scheme, the only additional line which must be provided is the TEST line 44. The plurality of the L1 latch 32 and the L2 latch 34 are interconnected in cascade fashion as shown. Either the output line 52 or 54 from the L2 latch 34 is connected to the SCANIN line of a succeeding L1 latch 32. When the last SRL arrangement has been interconnected into the cascade, either the output line 52 or 54 from its L2 latch 34 will be taken to the SCANOUT terminal. An external input source is connected to the SCANIN line to the first L1 latch 32 which enters scan data into all of the interconnected basic SRL arrangements. Further, each of the basic SRL arrangements is connected to the DCVS circuit so as to receive the corresponding complementary tree outputs on lines 30 and 38. The output lines 40 and 42 from each of the L1 latches 32 are connected to a succeeding DCVS circuit.

Referring again to FIG. 5, the testing protocol which uses the enhanced testability of the present invention is now described. During the LSSD mode of operation, an input test pattern (deterministic or random) is scanned into the cascaded basic SRL arrangements located at the input side of the DCVS circuit by using multiple cycles of the A-CLOCK and B-CLOCK signals with the TEST signal at logic 0. The response of the DCVS circuit is then latched into the plurality of the basic SRL arrangements located at the output side of the DCVS circuit during the DCVS test capture mode of operation by using the B-CLOCK signal with the TEST signal on line 44 at logic 1. As a result, the XORed results of the complementary tree outputs from the DCVS circuit are latched into the corresponding L2 latches 34 respectively. This response is then scanned out or serially presented at the SCANOUT terminal during the LSSD mode of operation by using multiple cycles of the A-CLOCK and B-CLOCK signals with the TEST signal on line 44 at logic 0. It would be readily understood by those skilled in the art that this response visible at the SCANOUT terminal indicates whether or not the DCVS circuit contains any single fault therein. The C-CLOCK and DATA ports of the L1 latch 32 must also be tested in order to assure correct testing operations as previously described, but this is relatively simple and can be done by holding the TEST signal on line 44 at logic 0, scanning in a few patterns, latching the response using the C-CLOCK, and then scanning out the results.

In order to evaluate the effectiveness of the approach in accordance with the invention, a fault simulator which is based on the Boolean level representation of a DCVS circuit as set forth in the above-cited copending application was used to provide fault coverage statistics (i.e., the percentage of detected faults for a given number of test patterns) for various DCVS designs. In so doing, each of the tree outputs (true and complement) is masked so that only one of the following combinations is possible (for all logic trees) at any time:

1. both tree outputs are visible;
2. only the true tree output is visible (the complement tree output is masked out and held constant);
3. only the complement tree output is visible; or
4. only the XOR of both tree outputs is visible.

With this setup, it is easy to simulate DCVS designs and evaluate the effect of output visibility on coverage. Again, the only tree outputs affected by the masking described above, are those which are observable at the inputs to the SRL arrangements.

From a number of DCVS designs simulated, two examples of the simulation results are presented herein. The first exa;nple is the logic module structure shown in FIG. 2. Because of the small number of input combinations (say 16), all possible input patterns could be applied to the logic module structure. The exposure results are summarized in Table 1 below.

TABLE 1

| Unexposed Faults for the Logic Module in FIG. 2. | |
|---|---|
| Output Visibility | Unexposed Faults |
| Both Tree Outputs | 0 |
| True Tree Output Only | 5 |
| Complement Tree Output Only | 8 |
| XOR | 0 |

When only one tree output is visible, two types of faults are not exposed. There are either those which cause that particular tree output to be stuck (i.e., defects on the buffer and precharge circuit 12), or those which affect only one tree output. An example for the latter case is stuck-at-0 or stuck-at-1 fault of NMOS switch X in FIG. 2 and observing the complement tree output F0 only. From the results as indicated in Table 1, it is apparent that visibility for the XOR is equivalent to visibility for both tree outputs. Also, it is clear that either is superior to the case where only one tree output is visible.

A second example of a DCVS design is almost equivalent to the Texas Instruments 74181 ALU. This design has 18 logic trees with several tree outputs serving as controlling inputs for other logic trees. For this design, pseudo-random inputs were used, taking care to use only functional inputs. That is, only one of a pair of inputs, which are supposedly complements of each other, is taken randomly, while its partner is explicitly set to the complement. The exposure result for this case, after 100,000 input patterns, is given in Table 2.

TABLE 2

| Unexposed Faults for the ALU Design | |
|---|---|
| Output Visibility | Unexposed Faults |
| Both Tree Outputs | 3 |
| True Tree Output Only | 43 |
| Complement Tree Output Only | 33 |
| XOR | 3 |

Again we notice the advantage of the XOR scheme over the cases where only one tree output is visible. It is interesting to notice that one of the faults which were not exposed for either the XOR or both tree outputs visible cases, relate to redundancy feature in the ALU design. For this particular case, the function being implemented was a 3-way XOR with two inputs dependent on each other. A simple change in the XOR logic tree, which simply reordered the inputs, resolved this problem (i.e., exposed all possible faults) without changing the functionality of the ALU design.

There has thus been described a basic SRL arrangement including an additional control circuitry 36 comprised of an XOR circuit 56 which enables to replace the latching of a single tree output of a DCVS circuit by the XOR of both tree outputs under the control of an extra TEST input 44. The above form of the basic SRL arrangement is advantageous in that it allows not only to maintain full observability during testing of a DCVS circuit but also requires a minimum change in the existing LSSD scheme in order to provide high degree of observability.

While the basic SRL arrangement of the invention is adapted for testing a DCVS circuit, it should be noted that this arrangement may be used for testing other combinational logic circuits as well which have the same operational characteristics as a DCVS circuit. It will be readily apparent to those skilled in the appertaining art that modifications and variations in the present invention can be made without departing from its spirit and scope. For example, the basic SRL arrangement of the single-latch form as shown in FIG. 4 or FIG. 5 can be easily modified to the double-latch form, by simply activating the B-CLOCK signal also during the functional mode, and by connecting the output of the L2 latch 34 (rather than that of the L1 latch 32) to a succeeding DCVS circuit. With this modification, it is apparent that normal system operation can proceed as before. Accordingly, it is not intended that the present invention be limited to the specifics of the foregoing description of the preferred embodiment or equivalents thereof, but instead should be considered as being limited solely by the claims appended hereto.

Having thus decribed our invention, what we claim as new and desire to secure by Letters Patent is:

1. A shift register latch arrangement for a combinational logic circuit having at least one pair of output lines wherein said combinational logic circuit Produces either complementary output signals indicative of a result of a logical function performed or non-complementary output signals on said output lines depending on whether or not a fault in said combinational logic circuit is propagated to said output lines, said shift register latch arrangement comprising:

first clock means for providing a first clock signal train at an output means thereof;

a first latch device having at least one output line, said first latch device being coupled and responsive to one of said combinational logic circuit output lines and said first clock signal output means for latching and producing at said first latch device output line, during each period of said first clock signal train, one of said combinational logic circuit output signals;

second clock means for providing a second clock signal train at an output means thereof;

a second latch device having input means coupled to said first latch device output line and having at least one output line, said second latch device being coupled and responsive to said second latch device input means and said second clock signal output means for latching and producing at said second latch device output line, during each period of said second clock signal train, said one of the combinational logic circuit output signals; and test data input means including exclusive OR circuit means connected to said combinational logic circuit output lines, said test data input means further including means coupled and responsive to a test control signal for disabling said second latch device input means, said exclusive OR means having an output coupled to said second latch device input means, said second latch device latching and producing an exclusive ORed result of said combinational logic circuit output signals on said second latch device output line.

2. The shift register latch arrangement in accordance with claim 1 wherein:

said test data input means further includes additional second latch device input means coupled and responsive to said test control signal line for latching said exclusive ORed result into said second latch device.

3. The shift register latch arrangement in accordance with claim 1 wherein:

said combinational logic circuit is a differential cascode voltage switch circuit which comprises one or more cascaded logic modules, each producing a pair of output signals.

4. The shift register latch arrangement in accordance with claim 1, wherein:

said first latch device is further coupled and responsive to a scan-in line and a third clock signal train which is out-of-phase with respect to said second clock signal train for latching and producing at said first latch device output line, during each period of said third clock signal train, a signal on said scan-in line.

5. The shift register latch arrangement in accordance with claim 4 wherein there is provided:

an additional plurality of said first latch devices, said second latch devices and said test data input means corresponding to the number of additional pairs of said combinational logic circuit output lines;

means interconnecting in cascade from said output line of each of said second latch devices except the last in the cascade to said scan-in line of a succeeding one of said additional second latch devices;

test control signal means coupled to all said test data input means to enable said test data input means; and scan data output means coupled to said output line of said second latch device of the last in the cascade whereby, in response to said third and second clock signal trains, the contents of all said first latch devices and second latch devices are provided in sequence at said scan data output means.

6. The shift register latch arrangement in accordance with claim 5 wherein there is provided:

scan data input means coupled to said scan-in line of the first of said first latch devices in the cascade for sequentially receiving a binary bit pattern whereby, in response to said third and second clock signal trains, the binary bit pattern is shifted through said first latch devices and second latch devices.

* * * * *